United States Patent
Peng

(10) Patent No.: US 10,679,031 B2
(45) Date of Patent: Jun. 9, 2020

(54) FINGERPRINT ACQUISITION METHOD AND ELECTRONIC DEVICE THEREOF

(71) Applicant: Lenovo (Beijing) Co., Ltd., Beijing (CN)

(72) Inventor: Shaopeng Peng, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 116 days.

(21) Appl. No.: 15/941,282

(22) Filed: Mar. 30, 2018

(65) Prior Publication Data

US 2019/0102594 A1  Apr. 4, 2019

(30) Foreign Application Priority Data

Sep. 29, 2017  (CN) .......................... 2017 1 0907063

(51) Int. Cl.
| | |
|---|---|
| *G06K 9/20* | (2006.01) |
| *G06K 9/00* | (2006.01) |
| *H01L 27/32* | (2006.01) |
| *G06K 9/03* | (2006.01) |

(52) U.S. Cl.
CPC ....... *G06K 9/0004* (2013.01); *G06K 9/00087* (2013.01); *G06K 9/00912* (2013.01); *G06K 9/036* (2013.01); *H01L 27/323* (2013.01)

(58) Field of Classification Search
CPC . H01L 27/3225; H01L 27/323; G06K 9/0004; G06K 9/00006–0012
See application file for complete search history.

(56) References Cited

U.S. PATENT DOCUMENTS

| | | | | |
|---|---|---|---|---|
| 7,321,672 B2* | 1/2008 | Sasaki | ............... | G06K 9/0004 250/556 |
| 2017/0300736 A1* | 10/2017 | Song | ............... | G06K 9/00033 |
| 2019/0012555 A1* | 1/2019 | Bae | ............... | G06K 9/209 |

FOREIGN PATENT DOCUMENTS

| | | |
|---|---|---|
| CN | 101833651 A | 9/2010 |
| CN | 102103685 A | 6/2011 |
| CN | 105069438 A | 11/2015 |
| CN | 106355160 A | 1/2017 |
| CN | 106970495 A | 7/2017 |
| CN | 107168469 A | 9/2017 |

* cited by examiner

*Primary Examiner* — Brian Werner
(74) *Attorney, Agent, or Firm* — Anova Law Group, PLLC

(57) ABSTRACT

A fingerprint acquisition method and an electronic device are provided. The method includes obtaining a triggering instruction for calling a fingerprint identification component of an electronic device. The method also includes in response to the triggering instruction, activating at least one pixel cell of a display screen of the electronic device corresponding to a fingerprint acquisition region. The at least one pixel cell of the display screen in a active state is used as a light source of the fingerprint identification component. Reflected light is generated with respect to the at least one pixel cell in the active state, as a finger is placed in the fingerprint acquisition region. The at least one pixel cell in the active state presents a first color of a green-series.

18 Claims, 4 Drawing Sheets

FINGERPRINT ACQUISITION METHOD AND ELECTRONIC DEVICE THEREOF

CROSS-REFERENCES TO RELATED APPLICATIONS

This application claims the priority of Chinese patent application No. 201710907063.9, filed on Sep. 29, 2017, the entirety of which is incorporated herein by reference.

FIELD OF THE DISCLOSURE

The present disclosure generally relates to the field of fingerprint identification device technology and, more particularly, relates to a fingerprint acquisition method and an electronic device thereof.

BACKGROUND

Nowadays, electronic devices with a touch display function have been widely used to people's daily life and work. One of main parts of the electronic device for realizing the touch display function is the touch display screen.

Organic light-emitting diode (OLED) touch display screens, as one of current mainstream display devices, are featured with various advantages, including high contrast, wide color gamut, and low-power consumption, etc. The OLED touch display screens have been widely used in many fields, such as image display, indicator light, and illumination lamp. An OLED touch display screen often includes an OLED display panel and a touch unit attached to a display side of the OLED display panel. Thus, the OLED touch display screen has a touch function and a display function at the same time.

As the electronic device has more powerful functions, more personal information and more important information may be stored in the fingerprint identification device. The realization of fingerprint identification, by integrating a fingerprint identification device in the touch display screen, is one of important technical means to ensure security of personal information.

A common method for the OLED touch display screen to realize fingerprint identification includes integrating an optical fingerprint sensor in a backside of the OLED display panel. To ensure the accuracy of fingerprint acquisition, a fingerprint acquisition region of the OLED display panel corresponding to the optical fingerprint sensor has to be in a highlighted mode (the brightness is greater than the brightness for normal image display in the fingerprint acquisition region). However, in the OLED display panel, brightness decay rates of the pixels of the three primary colors are different. In particular, the brightness decay rate of a blue pixel is greater than the brightness decay rates of both a red pixel and a green pixel. Thus, as the usage time increases, the brightness decay degree of the blue pixel in the fingerprint acquisition region is much greater than that in other display regions, and the image display quality of the OLED touch display screen is affected.

The disclosed method and electronic device are directed to solve one or more problems set forth above and other problems.

BRIEF SUMMARY OF THE DISCLOSURE

One aspect of the present disclosure includes a method. The method includes obtaining a triggering instruction for calling a fingerprint identification component of an electronic device. The method also includes in response to the triggering instruction, activating at least one pixel cell of a display screen of the electronic device corresponding to a fingerprint acquisition region. The at least one pixel cell of the display screen in an active state is used as a light source of the fingerprint identification component. Reflected light is generated with respect to the at least one pixel cell in the active state, as a finger is placed in the fingerprint acquisition region. The at least one pixel cell in the active state presents a first color of a green-series.

Another aspect of the present disclosure includes a device. The device includes a display screen, a fingerprint identification component, and a processor. The display screen includes a display region, and the display region includes a fingerprint acquisition region. The fingerprint identification component is disposed on a backlight side of the display screen and opposite to the fingerprint acquisition region. The processor is coupled to the display screen and the fingerprint identification component. The processor obtains a triggering instruction for calling the fingerprint identification component of the electronic device, and in response to the triggering instruction, activates at least one pixel cell of the display screen of the electronic device corresponding to the fingerprint acquisition region. The at least one pixel cell of the display screen in a active state is used as a light source of the fingerprint identification component. Reflected light is generated with respect to the at least one pixel cell in the active state, as a finger is placed in the fingerprint acquisition region. The at least one pixel cell in the active state presents a first color of a green-series.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION

Reference will now be made in detail to various embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

The disclosed embodiments of the present disclosure are merely examples for illustrating the general principles of the disclosure. Any equivalent or modification thereof, without departing from the spirit and principle of the present disclosure, falls within the true scope of the present disclosure.

A display screen often acquires a fingerprint using an optical fingerprint sensor. To ensure that the optical fingerprint sensor can acquire more reflected light of the finger, pixel cells in the fingerprint acquisition region of the OLED display panel of the display screen corresponding to the optical fingerprint sensor has to be in a highlighted mode, which has greater brightness than normal image display. However, brightness decay rates of pixels of different colors in the OLED are different and, in particular, the brightness decay rate of the blue pixel is the greatest. Thus, as the usage time increases, the brightness decay degree of the blue pixels in the pixel cells in the fingerprint acquisition region is much greater than the brightness decay degree of the blue pixels in the pixel cells in other regions of the OLED display panel. Accordingly, the brightness decay degree of the blue pixel in the display screen is different, and the image display quality of the display screen is affected.

The present disclosure provides a fingerprint acquisition method and an electronic device. In response to acquiring the fingerprint, by adjusting the light-emission intensities of the pixels of different primary colors in the pixel cells in the fingerprint acquisition region, the issue of inconsistent brightness decay degree of blue pixels in different regions of the display screen may be resolved to improve the image display quality of the display screen.

Figure 1:
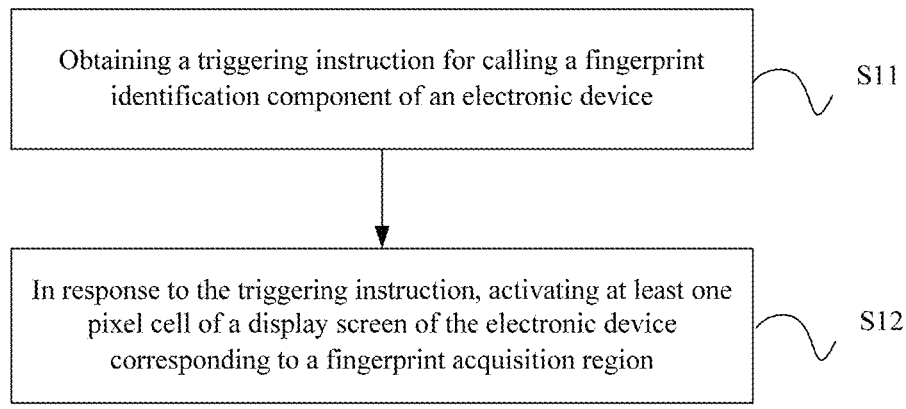
FIG. 1 illustrates a flow chart of an example of a fingerprint acquisition method consistent with various disclosed embodiments of the present disclosure.

FIG. 1 illustrates a flow chart of a fingerprint acquisition method consistent with various disclosed embodiments of the present disclosure. The disclosed fingerprint acquisition method may be used to perform a fingerprint identification by an electronic device. The fingerprint acquisition method may include the following.

In S11: Obtaining a triggering instruction for calling a fingerprint identification component of the electronic device. The electronic device may include a display screen. The display screen may include an OLED display panel, a touch unit on a display side of the OLED display panel, and the fingerprint identification component on a backside opposing to the display side of the OLED display panel. The electronic device may generate the triggering instruction by triggering the touch unit. For example, the triggering instruction may be generated by touching an application that desires fingerprint authentication and is displayed on the display screen. The application may be a shopping APP, or an online banking APP, etc.

The fingerprint identification component may be an optical fingerprint sensor, and may acquire fingerprint information by using reflected light of a finger. The display screen may include the OLED display panel having a plurality of pixel cells arranged in an array. A pixel cell may include a red pixel, a green pixel, and a blue pixel.

In S12: In response to the triggering instruction, activating at least one pixel cell of the display screen of the electronic device corresponding to the fingerprint acquisition region. The at least one pixel cell of the display screen in the fingerprint acquisition region in an active state may be used as a light source of the fingerprint identification component. Thus, in response to the finger being in the fingerprint acquisition region, reflected light is generated with respect to the at least one pixel cell in the active state. The at least one pixel cell in the active state may present a first color of a green-series. That is, in the pixel cell, a component of the green pixel may be larger than a component of the red pixel and a component of the blue pixel. The green pixel may have the highest brightness compared to the blue pixel and the red pixel.

In some embodiments, because red light waveband easily passes through the finger and has small contribution to the reflected light for acquiring the fingerprint information, the component of the red pixel in the at least one pixel cell in the fingerprint acquisition region in the active state may be zero. That is, the red pixel may not emit light. In other embodiments, the component of the red pixel may be a non-zero value. In some embodiments, the component of the green pixel may be a maximum value. In other embodiments, the component of the green pixel may be any value greater than zero and less than the maximum value. In some embodiments, the component of the blue pixel may be zero. In other embodiments, the component of the blue pixel may be a non-zero value. For example, in response to the pixel cell displaying the first color, the component of the blue pixel may be b1, the component of the green pixel may be g1, and the component of the red pixel may be r1, where g1 may be the largest. For example, for a 0-255 grayscale display mode, r1 may be configured as a positive integer not less than 0 and less than 255, g1 may be configured as a positive integer greater than 0 and not greater than 255, b1 may be configured as a positive integer not less than 0 and less than 255, and g1 may be greater than both r1 and b1. In some embodiments, r1=b1=0, and g1=255. Accordingly, the brightness of both the red pixel and the blue pixel may be zero, and the brightness of the green pixel may be the maximum value. The highlighted mode in the fingerprint acquisition region may be realized by using the green pixel having the maximum brightness alone to acquire a fingerprint image of the finger.

The display screen may include the fingerprint acquisition region. The display screen may include a first surface and an opposing second surface. The first surface may be a display side. The fingerprint identification component may be located at a side facing the second surface and opposing to the fingerprint acquisition region. To ensure the display screen capable of having desired brightness, the second surface may be provided with a reflective layer. The reflective layer may have an opening in a position corresponding to the fingerprint acquisition region, and the opening may be used for disposing the fingerprint identification component.

In the disclosed fingerprint acquisition method, in response to the fingerprint identification component acquiring the fingerprint, at least one pixel cell in the fingerprint acquisition region in the display screen may be activated. The pixel cell that is activated (e.g., providing illumination) in the fingerprint acquisition region of the display screen may present the first color of the green-series, that is, the green pixel in the pixel cell may have the highest brightness. The green pixel having a smaller brightness decay rate than the blue OLED pixel may serve as the light source of the fingerprint acquisition, and, thus, the brightness difference between the blue pixels in the fingerprint acquisition region and other regions may be reduced. Therefore, the brightness of the blue pixels in the display screen may be consistent, and the image display quality of the display screen may be ensured.

Figure 2:
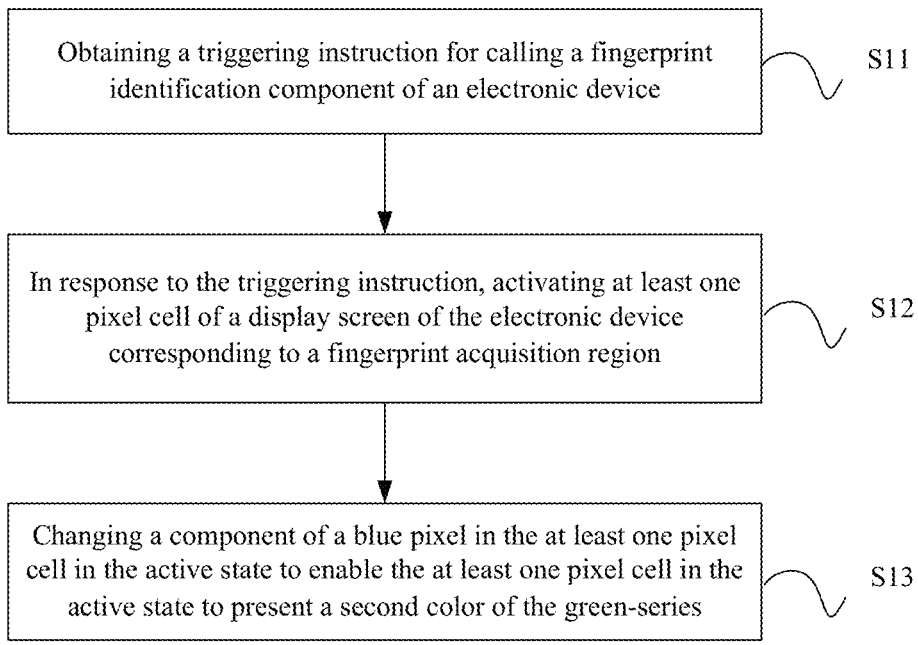
FIG. 2 illustrates a flow chart of another example of a fingerprint acquisition method consistent with various disclosed embodiments of the present disclosure.

FIG. 2 illustrates a flow chart of another fingerprint acquisition method consistent with various disclosed embodiments of the present disclosure. The similarities between FIG. 1 and FIG. 2 are not repeated herein, while certain differences may include the following.

In S13: Changing the component of the blue pixel in the at least one pixel cell in the active state to enable the at least one pixel cell in the active state to present a second color of the green-series.

After changing the component of the blue pixel in the pixel cell, the pixel cell may present the second color of the green-series. That is, in the pixel cell, the green pixel may still have the highest brightness, and the main display color may be green.

The quality of the acquired fingerprint image may be improved by S13, facilitating the fingerprint identification component to perform the fingerprint identification. In S12, the component of the blue pixel may be b1. In S13, the component of the blue pixel may increase and, thus, the proportion of the blue light may increase. In response to acquiring the fingerprint and displaying the first color, the blue pixel in the pixel cell in the fingerprint acquisition region may have to be displayed with the small component b 1. In response to displaying the second color, the component of the blue pixel in the pixel cell may increase to facilitate obtaining the desired fingerprint image. Therefore, in the disclosed fingerprint acquisition method, the blue pixel in the activated pixel cell in the fingerprint acquisition region may not have to emit light with high component throughout the entire fingerprint acquisition process. Thus, the brightness decay degree of the blue pixel in the fingerprint acquisition region with respect to other regions may be reduced, and the brightness of blue pixels in the display screen may be consistent, thereby ensuring the display quality.

In some embodiments, changing the component of the blue pixel in the at least one pixel cell in the active state in S13 may include increasing the component of the blue pixel. Accordingly, the component of the blue pixel in the at least one pixel cell in the active state and presenting the second color of the green-series may be greater than the component of the blue pixel in the at least one pixel cell in the active state and presenting the first color of the green-series. In other embodiments, the component of the blue pixel may gradually increase until the fingerprint identification component successfully identifies the fingerprint based on the reflected light of the finger with respect to the at least one pixel cell in the active state. The disclosed one method for increasing the component of the blue pixel may include directly changing the component of the blue pixel to b2 from b1, to facilitate obtaining the fingerprint image with desired quality and realizing the fingerprint identification. The disclosed another method for increasing the component of the blue pixel may include gradually increasing the component of the blue pixel to b3 from b1, to obtain the fingerprint image that meets the minimum quality requirements desired for the fingerprint identification, where b3 may be equal to or less than b2.

Activating the at least one pixel cell of the display screen of the electronic device corresponding to the fingerprint acquisition region may include displaying a first image identification in the fingerprint acquisition region. The first image identification may be dominated by the first color of the green-series. In other words, the display image in the fingerprint acquisition region may be dominated by the green-series. In some embodiments, the color of the first image identification may be green, and the background color may be non-green. In other embodiments, the background color may be green, while the color of the first image identification may be non-green. In certain embodiments, both the color of the first image identification and the background color may be in the green-series, while the proportion of the green color in the green-series of the first image identification may be different from the proportion of the green color in the green-series of the background color.

In some embodiments, changing the component of the blue pixel in the at least one pixel cell in the active state may include replacing the first image identification in the fingerprint acquisition region with a second image identification. The second image identification may be dominated by the second color of the green-series. In other embodiments, changing the component of the blue pixel in the at least one pixel cell in the active state may include changing the component of the blue pixel in the pixel cell corresponding to the first color of the green-series in the first image identification.

The position of the fingerprint acquisition region may be indicated by the two successive image identifications. The first image identification may be dominated by the first color, and the component of the blue pixel in the pixel cell displaying the first image identification may be small. The second image identification may be dominated by the second color, and the component of the blue pixel in the pixel cell displaying the second image identification may be large. Accordingly, during the fingerprint acquisition process, the blue pixel in the pixel cell displaying the image identification may not have to be always displayed with a large component. At the same time, the position of the fingerprint acquisition region may be indicated by switching the two image identifications.

Directly increasing the component of the blue pixel may include the following two methods. One method may include in response to the finger being in the fingerprint acquisition region and the fingerprint identification being unsuccessful within a preset time, increasing the component value of the blue pixel. That is, in response to the finger being in the fingerprint acquisition region and the fingerprint identification being unsuccessful within a preset time, the component of the blue pixel may be directly changed to b2 from b1 to make the fingerprint identification successful. The increased component b2 of the blue pixel may be obtained through experimental simulations, such that the fingerprint identification component may identify the fingerprint in response to the component of the blue pixel being b2.

Figure 3:
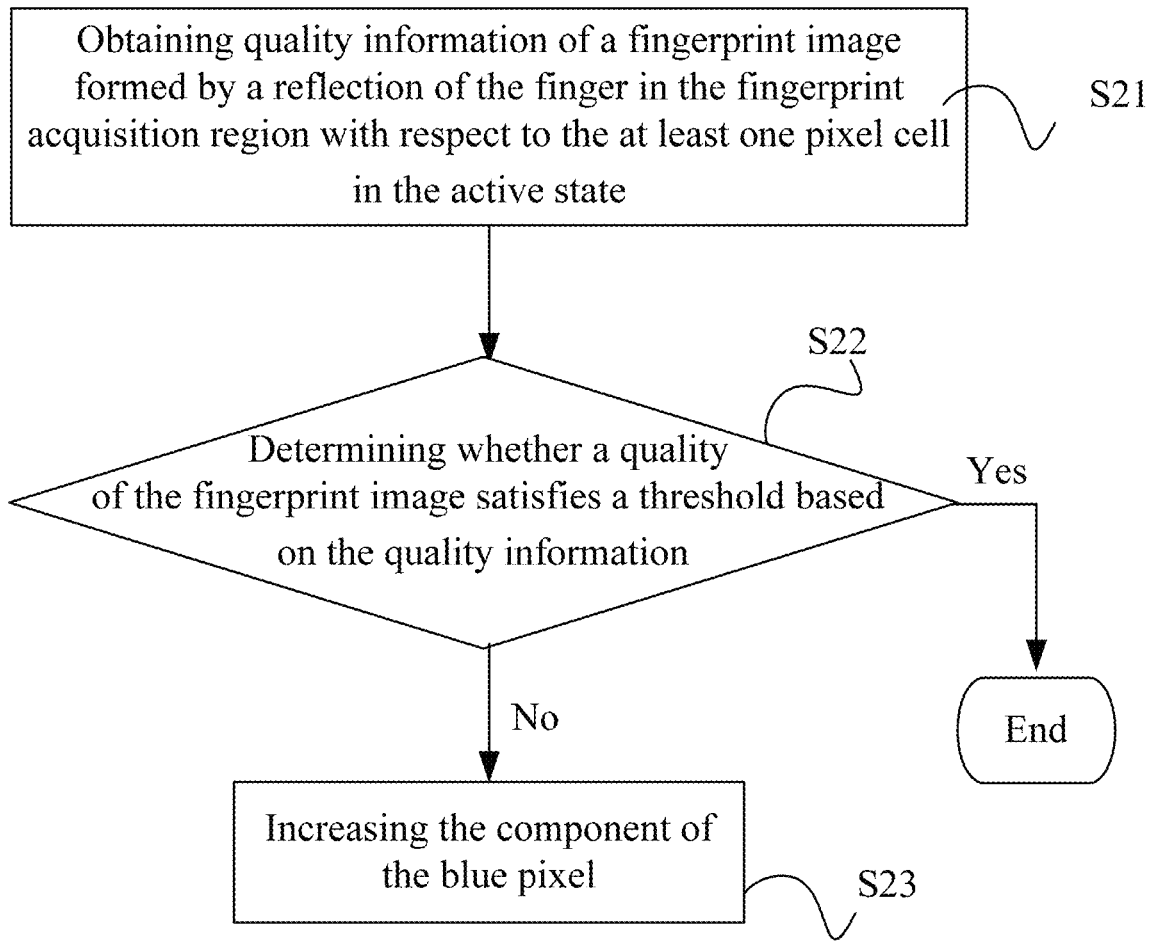
FIG. 3 illustrates a flow chart of a method for increasing a component of a blue pixel in an example of a fingerprint acquisition method consistent with various disclosed embodiments of the present disclosure.

FIG. 3 illustrates a flow chart of another method for increasing the component of the blue pixel in an example of a fingerprint acquisition method consistent with various disclosed embodiments of the present disclosure. Referring to FIG. 3, the method may include the following.

In S21: Obtaining quality information of the fingerprint image formed by a reflection of the finger in the fingerprint acquisition region with respect to the at least one pixel cell in the active state.

In S22: Determining whether a quality of the fingerprint image satisfies a threshold based on the quality information and generating a determination result.

In S23: Increasing the component of the blue pixel based on the determination result that the quality of the fingerprint image does not satisfy the threshold.

In response to the quality of the fingerprint image satisfying the threshold, the fingerprint may be identified and the method may be ended. In response to the quality of the fingerprint image not satisfying the threshold, the component of the blue pixel may increase, i.e., the component of the blue pixel may increase to b2 from the initial b1, such that the fingerprint identification component may identify the fingerprint.

Gradually increasing the component of the blue pixel may include the following two methods, for example. One method may include, in response to the finger being in the fingerprint acquisition region without receiving, within a preset time, a feedback signal that the fingerprint identification component successfully identifies the fingerprint, repeatedly increasing the component of the blue pixel by a step value until the fingerprint identification succeeds.

In the disclosed method, in response to the finger being in the fingerprint acquisition region without receiving, within a preset time, a feedback signal that the fingerprint identification component successfully identifies the fingerprint, the component of the blue pixel may gradually increase by a step value until the fingerprint identification succeeds. The fingerprint may be identified until the component of the blue pixel increases to b3. Accordingly, the minimum component of the blue pixel that satisfies the fingerprint identification may be determined, and the fingerprint may be identified with a small component of the blue pixel.

Figure 4:
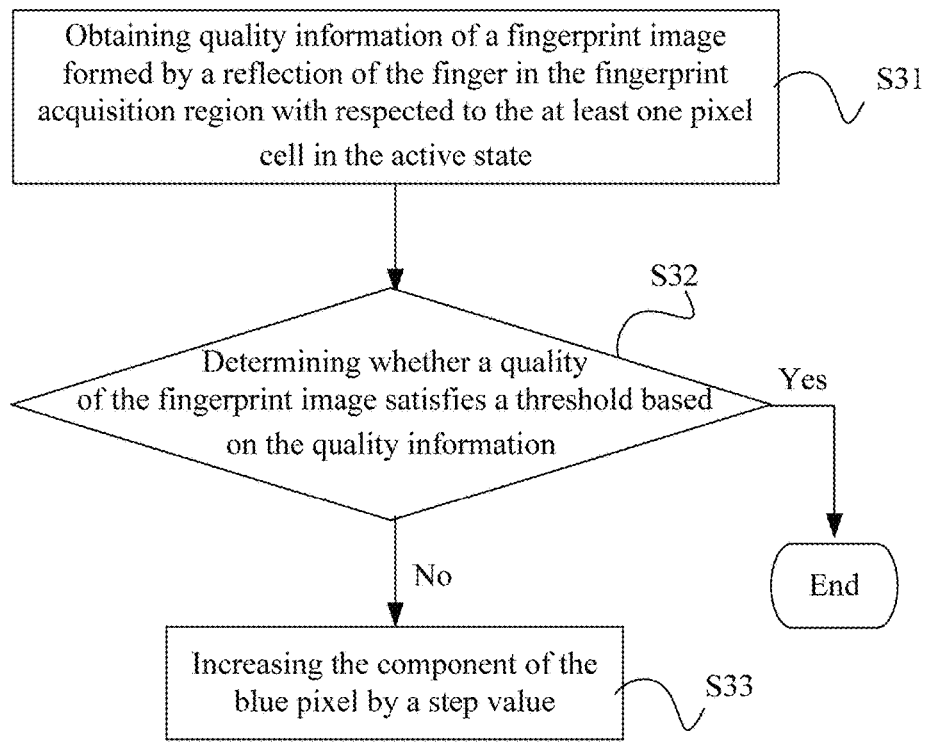
FIG. 4 illustrates a flow chart of a method for gradually increasing a component of a blue pixel in an example of a fingerprint acquisition method consistent with various disclosed embodiments of the present disclosure.

FIG. 4 illustrates a flow chart of another method for gradually increasing the component of the blue pixel in an example of a fingerprint acquisition method consistent with various disclosed embodiments of the present disclosure. Referring to FIG. 4, the method may include the following.

In S31: Obtaining quality information of the fingerprint image formed by a reflection of the finger in the fingerprint acquisition region with respect to the at least one pixel cell in the active state.

In S32: Determining whether a quality of the fingerprint image satisfies a threshold based on the quality information and generating a determination result.

In S33: Based on the determination result that the quality of the fingerprint image does not satisfy the threshold, repeatedly increasing the component of the blue pixel by a step value until the fingerprint identification succeeds.

In response to the quality of the fingerprint image satisfying the threshold, the fingerprint may be identified and the method may be ended. In response to the quality of the fingerprint image not satisfying the threshold, the component of the blue pixel may increase. After increasing the component of the blue pixel by a step value, the processes may return to S31 and be recycled until the quality of the fingerprint image satisfies the threshold to realize fingerprint identification. Similarly, the minimum component of the blue pixel that satisfies the fingerprint identification may be determined, and the fingerprint may be identified with a small component of the blue pixel.

Figure 5:
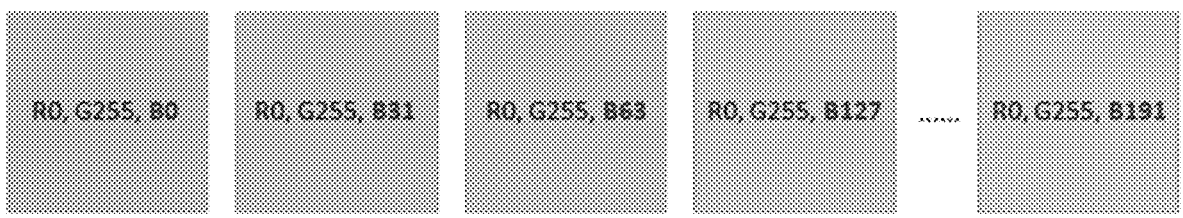
FIG. 5 illustrates a schematic diagram of a principle for changing a component of a blue pixel in an example of a fingerprint acquisition method consistent with various disclosed embodiments of the present disclosure.

In some embodiments, in response to gradually increasing the component of the blue pixel, the component of the blue pixel may gradually increase by a fixed step value. In other embodiments, each increased amount of the component of the blue pixel may not be exactly the same. FIG. 5 illustrates a schematic diagram of a principle for changing the component of the blue pixel in an example of a fingerprint acquisition method consistent with various disclosed embodiments of the present disclosure. Referring to FIG. 5, in response to displaying the first color, in the activated pixel cell in the fingerprint acquisition region, the component of the red pixel may be configured as 0, the component of the green pixel may be configured as the maximum value, and the component of the blue pixel may be configured as 0. In the 0-255 grayscale display mode, a grayscale coordinate of the pixel cell may be (R0, G255, B0). In response to gradually increasing the component of the blue pixel, the grayscale coordinates of the pixel cell may be successively configured as (R0, G255, B31), (R0, G255, B63), (R0, G255, B127), . . . , (R0, G255, B191), such that the proportion of the blue light in the light emitted from the pixel cell may gradually increase.

In the disclosed method in FIG. 5, the component of the green pixel in the pixel cell may be the largest. Therefore, during increasing the component of the blue pixel, the component of the green pixel may be always the largest, such that the pixel cell may always present a color in the green-series.

Figure 6:
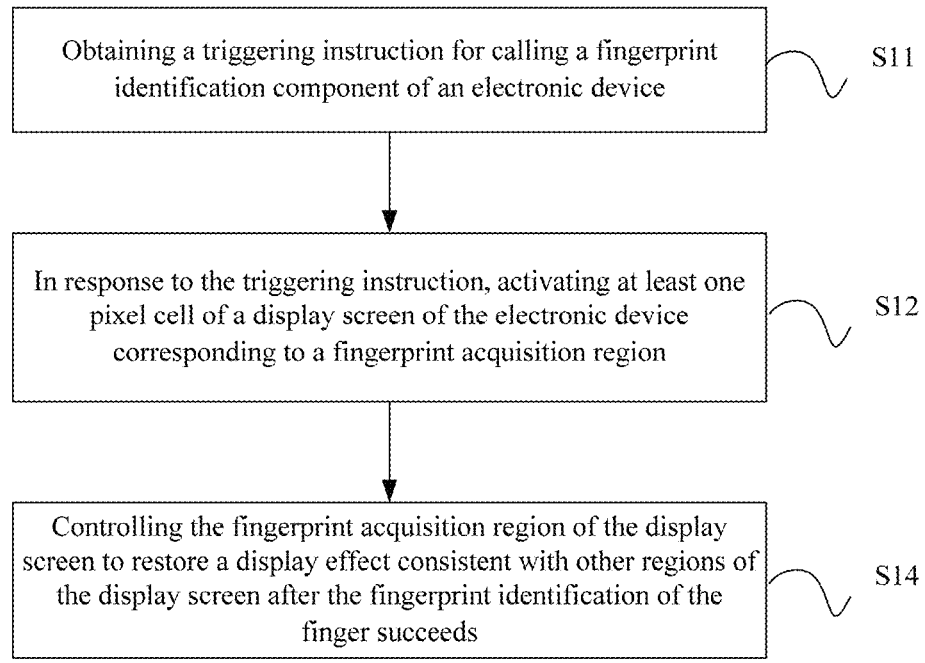
FIG. 6 illustrates a flow chart of another example of a fingerprint acquisition method consistent with various disclosed embodiments of the present disclosure.

FIG. 6 illustrates a flow chart of another fingerprint acquisition method consistent with various disclosed embodiments of the present disclosure. The similarities between FIG. 1 and FIG. 6 are not repeated herein, while certain differences may include the following.

In S14: Controlling the fingerprint acquisition region of the display screen to restore a display effect consistent with other regions of the display screen after the fingerprint identification of the finger succeeds. In response to the fingerprint acquisition method including the process in S13, the process in S14 may be performed following the process in S13.

Through the fingerprint acquisition method in FIG. 6, after completing the fingerprint acquisition, the pixel cell in the fingerprint acquisition region may have the display effect consistent with the pixel cells in other regions of the display screen. Therefore, after the finger leaves the fingerprint acquisition region, the entire display image may be displayed.

In the disclosed fingerprint acquisition method, the at least one pixel cell of the display screen of the electronic device corresponding to the fingerprint acquisition region may be activated in response to acquiring the fingerprint. The at least one pixel cell of the display screen in the fingerprint acquisition region in the active state may be used as the light source of the fingerprint identification component. Thus, in response to the finger being in the fingerprint acquisition region, reflected light may be generated with respect to the at least one pixel cell in the active state. The at least one pixel cell in the active state may present the first color of the green-series. Accordingly, in the pixel cell in the fingerprint acquisition region in the active state, the brightness of the green pixel may be larger than the brightness of the red pixel and the brightness of the blue pixel. The green pixel with the brightness decay rate less than the blue OLED pixel may serve as the light source of the fingerprint acquisition, thus, the brightness difference between the blue pixels in the fingerprint acquisition region and other regions of the display screen may be reduced. Therefore, the brightness of the blue pixels in the display screen may be consistent, and the image display quality of the display screen may be ensured.

In the disclosed embodiments, the OLED screen may realize the fingerprint acquisition under the screen, and in particular, by a fingerprint sensor based on optical principles. Because the pixels of the screen may have to emit light instead of the light source of the fingerprint sensor, the pixels of the display screen corresponding to the fingerprint acquisition region may be frequently in the highlighted mode and may have a longer cumulative light-emission time compared to other regions. Thus, a burn in may occur and may not disappear. The brightness decay degree of the blue pixel may be large, resulting in a difference in color temperature. Therefore, in response to the pixel of the OLED display screen corresponding to the fingerprint acquisition region being used as the light source of the fingerprint sensor, the light emission of the blue pixel or the proportion of the blue pixel in the highlighted mode may be minimized. That is, in response to the pixel of the OLED display screen corresponding to the fingerprint acquisition region being used as the light source of the fingerprint sensor, the fingerprint acquisition region may display the green-series light, or the green-series pattern. Accordingly, not only the desired light for realizing the fingerprint acquisition may be provided, but also the occurrence of the burn in in the fingerprint acquisition region may be resolved. At the same time, the green-series light or the green-series pattern may prompt the user where the fingerprint acquisition region is located.

Figure 7:
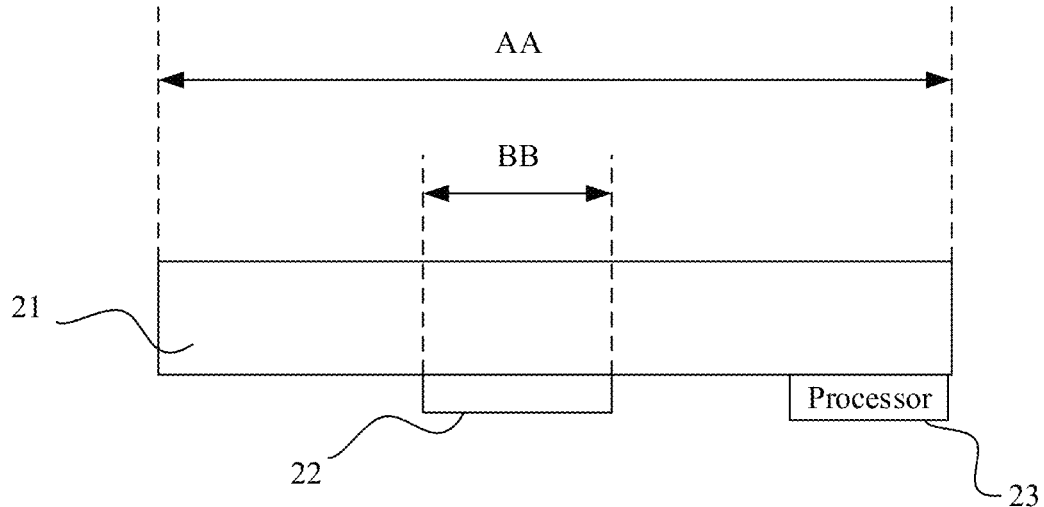
FIG. 7 illustrates a structural diagram of an example of an electronic device consistent with various disclosed embodiments of the present disclosure.

The present disclosure also provides an electronic device. The electronic device may execute the disclosed fingerprint acquisition method. FIG. 7 illustrates a structural diagram of an example of an electronic device consistent with various disclosed embodiments of the present disclosure. Referring to FIG. 7, the electronic device may include a display screen 21, a fingerprint identification component 22, and a processor 23. The display screen 21 may include a display region 'AA', and the display region 'AA' may include a fingerprint acquisition region 'BB'. The fingerprint identification component 22 may be disposed on a backlight side of the display screen 21 and opposite to the fingerprint acquisition region 'BB'. The processor 23 may be coupled to the display screen and the fingerprint identification component. The processor 23 may obtain a triggering instruction for calling the fingerprint identification component 22 of the electronic device, and in response to the triggering instruction, may activate the at least one pixel cell of the display screen 21 of the electronic device corresponding to the fingerprint acquisition region 'BB'.

The at least one pixel cell in an active state may present a first color of a green-series. The at least one pixel cell of the display screen 21 in the fingerprint acquisition region in the active state may be used as a light source of the fingerprint identification component. Thus, in response to the finger being in the fingerprint acquisition region, reflected light may be generated with respect to the at least one pixel cell in the active state.

The electronic device may include one or more processors 23, for controlling the display screen 21, the fingerprint identification component 22 and other electronic units of the electronic device to execute corresponding functions, respectively or jointly.

The processor 23 may change a component of a blue pixel in the at least one pixel cell in the active state, such that the at least one pixel cell in the active state may present a second color of the green-series. In some embodiments, the processor 23 may increase the component of the blue pixel. Thus, the component of the blue pixel in the at least one pixel cell in the active state and presenting the second color of the green-series may be greater than the component of the blue pixel in the at least one pixel cell in the active state and presenting the first color of the green-series. In other embodiments, the processor 23 may gradually increase the component of the blue pixel until the fingerprint identification component successfully identifies the fingerprint based on the reflected light of the finger with respect to the at least one pixel cell in the active state.

In some embodiments, the display screen 21 may be a full screen without a border region. A surface of the display screen 21 that emits light may be a display surface. In other embodiments, a width of the border region may be less than 5 mm, i.e., 4 mm.

The fingerprint acquisition region 'BB' may be smaller than the display region 'AA'. The fingerprint identification component 22 may be disposed in a preset position on a surface of the display screen 21 opposing to the display surface according to demands. Accordingly, the position of the fingerprint acquisition region 'BB' may be fixed, and the fingerprint acquisition may be performed at the preset position in response to acquiring the fingerprint.

In certain embodiments, the fingerprint identification component 22 corresponding to the entire display region 'AA' may be disposed on the surface of the display screen 21 opposing to the display surface. Accordingly, the entire display region 'AA' may serve as the fingerprint acquisition region 'BB', and the entire display region 'AA' may be used to acquire fingerprint information. The display screen 21 may be configured as a touch screen, and may include a touch electrode for sensing the touch position. In response to acquiring fingerprint, the touch position of the finger may be detected based on the touch electrode. Based on the detected touch position, the processor 23 may determine the fingerprint acquisition region 'BB' in the display region 'AA'. In response to the current touch position of the finger being in the fingerprint acquisition region 'BB', the fingerprint acquisition region may be configured in real time based on the touch position of the finger.

In the disclosed electronic device, the at least one pixel cell in the active state may present the first color of the green-series. Accordingly, in the pixel cell in the fingerprint acquisition region in the active state, the brightness of the green pixel may be larger than the brightness of the red pixel and the brightness of the blue pixel. The green pixel with the brightness decay rate less than the blue pixel may serve as the light source of the fingerprint acquisition, thus, the brightness difference between the blue pixels in the fingerprint acquisition region and other regions of the display screen may be reduced. Therefore, the brightness of the blue pixels in the display screen may be consistent, and the image display quality of the display screen may be ensured.

The various embodiments in the present specification are described in a progressive manner. Each embodiment mainly describes in terms of differences from other embodiments, and the same or similar parts between the various embodiments may be referred to each other.

The method, device, components and units in various embodiments of the present disclosure may be realized through a computing-capable electronic device that executes software containing computer instructions. The system may include a storage device to realize the various types of storage described above. The computing-capable electronic device may include but is not limited to a device capable of executing computer instructions, such as a general purpose processor, a digital signal processor, a dedicated processor, and a reconfigurable processor, etc. Execution of such instructions may cause the electronic device to be configured to perform the above-disclosed respective operations. The above devices and/or units may be realized in one electronic device or in different electronic devices. The software may be stored in the computer-readable storage medium. The computer-readable storage medium may store one or more programs (software units). The one or more programs may include instructions that enable the electronic device to perform the disclosed methods in the present disclosure in response to executing the instructions by one or more processors in the electronic device.

In some embodiments, the software may be stored in a form of volatile memory or non-volatile memory device, such as a memory device like ROM, no matter whether it is erasable or rewritable. In other embodiments, the software may be stored in a form of memory (e.g., RAM, memory chip, device, or integrated circuit). In certain embodiments, the software may be stored in an optically readable medium or a magnetically readable medium, such as a CD, a DVD, a magnetic disk, or a magnetic tape, etc. The memory device and the memory medium are examples of machine-readable memory devices that are suitable for storing one or more programs. The one or more programs may include instructions that enable implementation of disclosed embodiments in response to being executed. The present disclosure provides the program and a machine-readable memory device that stores the program. The program may include codes of the device or method for implementing any one of the claims in the present disclosure. In addition, the program may be electronically transmitted via any medium, such as communication signal carried over a wire connection or a wireless connection, and may be appropriately included in various embodiments of the present disclosure.

In some embodiments, the disclosed method, device, components and/or units may be realized through a hardware or firmware that uses any suitable way for integrating or packaging the circuit, such as a field-programmable gate array (FPGA), a programmable logic array (PLA), a system on a chip, a system on a substrate, a system on package, or an application specific integrated circuit (ASIC), etc. In other embodiments, the disclosed method, device, components and/or units may be realized through an appropriate combination of three implementations including software, hardware and firmware. The system may include a storage device to realize the storage described above. In response to being implemented by these ways, the used software, hardware and/or firmware may be programmed or designed to perform the disclosed above corresponding methods, and/or functions. Those skilled in the art may appropriately implement one or more of the systems and components, or one or more parts of the systems and components, using different above implementations according to actual needs. All of these implementations fall within the scope of the present disclosure.

In some embodiments, a non-transitory computer-readable storage medium including instructions, such as a memory including instructions executable by a processor to realize the above method, may be provided. For example, the non-transitory computer-readable storage medium may be a ROM, a random access memory (RAM), a CD-ROM, a magnetic tape, a floppy disk, and an optical data storage device, etc.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method, comprising:

obtaining a triggering instruction for calling a fingerprint identification component of an electronic device;

in response to the triggering instruction, activating at least one pixel cell of a display screen of the electronic device corresponding to a fingerprint acquisition region, wherein:

the at least one pixel cell of the display screen in an active state is used as a light source of the fingerprint identification component, reflected light is generated with respect to the at least one pixel cell in the active state, as a finger is placed in the fingerprint acquisition region, and the at least one pixel cell in the active state presents a first color of a green-series; and after activating the at least one pixel cell of a display screen, changing a component of a blue pixel in the at least one pixel cell in the active state to enable the at least one pixel cell in the active state to present a second color of the green-series.

2. The method according to claim 1, wherein changing the component of the blue pixel in the at least one pixel cell in the active state includes:

increasing the component of the blue pixel, wherein the component of the blue pixel in the at least one pixel cell in the active state and presenting the second color of the green-series is greater than the component of the blue pixel in the at least one pixel cell in the active state and presenting the first color of the green-series.

3. The method according to claim 1, wherein changing the component of the blue pixel in the at least one pixel cell in the active state includes:

gradually increasing the component of the blue pixel until the fingerprint identification component successfully identifies a fingerprint based on the reflected light of the finger with respect to the at least one pixel cell in the active state.

4. The method according to claim 1, wherein:

activating the at least one pixel cell of the display screen of the electronic device corresponding to the fingerprint acquisition region includes:

displaying a first image identification in the fingerprint acquisition region, wherein the first image identification is dominated by the first color of the green-series; and changing the component of the blue pixel in the at least one pixel cell in the active state includes one of:

replacing the first image identification in the fingerprint acquisition region with a second image identification, wherein the second image identification is dominated by the second color of the green-series, and changing the component of the blue pixel in the pixel cell corresponding to the first color of the green-series in the first image identification.

5. The method according to claim 2, wherein increasing the component of the blue pixel includes:

in response to the finger being in the fingerprint acquisition region and the fingerprint identification being unsuccessful within a preset time, increasing a component value of the blue pixel.

6. The method according to claim 2, wherein increasing the component of the blue pixel includes:
- obtaining quality information of a fingerprint image formed by a reflection of the finger in the fingerprint acquisition region with respect to the at least one pixel cell in the active state;
- determining whether a quality of the fingerprint image satisfies a threshold based on the quality information and generating a determination result; and
- increasing the component of the blue pixel based on the determination result that the quality of the fingerprint image does not satisfy the threshold.

7. The method according to claim 3, wherein gradually increasing the component of the blue pixel includes:
- in response to the finger being in the fingerprint acquisition region without receiving, within a preset time, a feedback signal that the fingerprint identification component successfully identifies the fingerprint, repeatedly increasing the component of the blue pixel by a step value until the fingerprint identification succeeds.

8. The method according to claim 3, wherein gradually increasing the component of the blue pixel includes:
- obtaining quality information of a fingerprint image formed by a reflection of the finger in the fingerprint acquisition region with respect to the at least one pixel cell in the active state;
- determining whether a quality of the fingerprint image satisfies a threshold based on the quality information and generating a determination result; and
- based on the determination result that the quality of the fingerprint image does not satisfy the threshold, repeatedly increasing the component of the blue pixel by a step value until the fingerprint identification succeeds.

9. The method according to claim 1, further including:
- controlling the fingerprint acquisition region of the display screen to restore a display effect consistent with other regions of the display screen after the fingerprint identification of the finger succeeds.

10. An electronic device, comprising:
- a display screen, wherein the display screen includes a display region, and the display region includes a fingerprint acquisition region;
- an optical fingerprint sensor disposed on a backlight side of the display screen and opposite to the fingerprint acquisition region, the optical fingerprint sensor being configured to acquire fingerprint information by using light reflected from a finger; and
- a processor, coupled to the display screen and the optical fingerprint sensor, wherein the processor obtains a triggering instruction for triggering the optical fingerprint sensor of the electronic device, and in response to the triggering instruction, activates at least one pixel cell of the display screen of the electronic device corresponding to the fingerprint acquisition region, wherein:
  - the at least one pixel cell of the display screen in an active state is used as a light source of the optical fingerprint sensor,
  - reflected light is generated with respect to the at least one pixel cell in the active state, as a finger is placed in the fingerprint acquisition region, and
  - the at least one pixel cell in the active state presents a first color of a green-series, and
  - after activating the at least one pixel cell of the display screen, the processor further changes a component of a blue pixel in the at least one pixel cell in the active state to enable the at least one pixel cell in the active state to present a second color of the green-series.

11. The device according to claim 10, wherein the processor:
- increases the component of the blue pixel, wherein the component of the blue pixel in the at least one pixel cell in the active state and presenting the second color of the green-series is greater than the component of the blue pixel in the at least one pixel cell in the active state and presenting the first color of the green-series.

12. The device according to claim 10, wherein the processor:
- gradually increases the component of the blue pixel until the optical fingerprint sensor successfully identifies a fingerprint based on the reflected light of the finger with respect to the at least one pixel cell in the active state.

13. The device according to claim 10, wherein:
- the processor displays a first image identification in the fingerprint acquisition region, wherein the first image identification is dominated by the first color of the green-series, and
- the processor performs one of:
  - replacing the first image identification in the fingerprint acquisition region with a second image identification, wherein the second image identification is dominated by the second color of the green-series, and
  - changing the component of the blue pixel in the pixel cell corresponding to the first color of the green-series in the first image identification.

14. The device according to claim 11, wherein the processor:
- in response to the finger being in the fingerprint acquisition region and the fingerprint identification being unsuccessful within a preset time, increasing a component value of the blue pixel.

15. The device according to claim 11, wherein the processor:
- obtains quality information of a fingerprint image formed by a reflection of the finger in the fingerprint acquisition region with respect to the at least one pixel cell in the active state;
- determines whether a quality of the fingerprint image satisfies a threshold based on the quality information and generates a determination result; and
- increases the component of the blue pixel based on the determination result that the quality of the fingerprint image does not satisfy the threshold.

16. The device according to claim 12, wherein the processor:
- in response to the finger being in the fingerprint acquisition region without receiving, within a preset time, a feedback signal that the optical fingerprint sensor successfully identifies the fingerprint, repeatedly increasing the component of the blue pixel by a step value until the fingerprint identification succeeds.

17. The device according to claim 12, wherein the processor:
- obtains quality information of a fingerprint image formed by a reflection of the finger in the fingerprint acquisition region, with respect to the at least one pixel cell in the active state;
- determines whether a quality of the fingerprint image satisfies a threshold based on the quality information and generates a determination result; and
- based on the determination result that the quality of the fingerprint image does not satisfy the threshold, repeatedly increases the component of the blue pixel by a step value until the fingerprint identification succeeds.

18. The device according to claim 10, wherein the processor:
controls the fingerprint acquisition region of the display screen to restore a display effect consistent with other regions of the display screen after the fingerprint identification of the finger succeeds.

* * * * *